United States Patent
Heo et al.

(10) Patent No.: US 10,076,030 B2
(45) Date of Patent: Sep. 11, 2018

(54) FLEXIBLE HYBRID SUBSTRATE FOR DISPLAY AND METHOD FOR MANUFACTURING SAME

(71) Applicant: Corning Precision Materials Co., Ltd., Chungcheongnam-do (KR)

(72) Inventors: Jin Nyoung Heo, Chungcheongnam-do (KR); Tae Hyo Park, Chungcheongnam-do (KR); Dong Keun Shin, Chungcheongnam-do (KR); Jong Taek Kim, Chungcheongnam-do (KR); Sang Yoon Oh, Chungcheongnam-do (KR); Jin Sung Lim, Chungcheongnam-do (KR)

(73) Assignee: Corning Precision Materials Co., Ltd. (KR)

(*) Notice: Subject to any disclaimer, the term of this patent is extended or adjusted under 35 U.S.C. 154(b) by 84 days.

(21) Appl. No.: 15/039,629

(22) PCT Filed: Nov. 24, 2014

(86) PCT No.: PCT/KR2014/011306
§ 371 (c)(1),
(2) Date: May 26, 2016

(87) PCT Pub. No.: WO2015/080442
PCT Pub. Date: Jun. 4, 2015

(65) Prior Publication Data
US 2017/0171968 A1   Jun. 15, 2017

(30) Foreign Application Priority Data
Nov. 26, 2013  (KR) .................. 10-2013-0144503

(51) Int. Cl.
*H05K 1/03*  (2006.01)
*H05K 3/00*  (2006.01)
*H05K 1/09*  (2006.01)

(52) U.S. Cl.
CPC ......... *H05K 1/0393* (2013.01); *H05K 1/0306* (2013.01); *H05K 1/0353* (2013.01);
(Continued)

(58) Field of Classification Search
CPC .. H05K 1/0393; H05K 1/0306; H05K 1/0353; H05K 1/09; H05K 3/0067
See application file for complete search history.

(56) References Cited

U.S. PATENT DOCUMENTS

2006/0088698 A1* 4/2006 Majumdar ............. H01B 1/122
  428/195.1
2011/0151201 A1* 6/2011 Lee ......................... G06F 3/044
  428/192

(Continued)

FOREIGN PATENT DOCUMENTS

KR  20080025467 A  3/2008
KR  20110072854 A  6/2011

(Continued)

OTHER PUBLICATIONS

International Search Report for International Application No. PCT/KR2014/011306, dated Mar. 16, 2015.

*Primary Examiner* — Hoa C Nguyen
*Assistant Examiner* — Amol Patel
(74) *Attorney, Agent, or Firm* — Lerner, David, Littenberg, Krumholz & Mentlik, LLP

(57) ABSTRACT

The present invention relates to a flexible hybrid substrate for a display and a method for manufacturing the same and, more specifically, to a flexible hybrid substrate for a display, which has a reduced occurrence of cracks, an improved level
(Continued)

of flexibility, and can be used in a high-temperature process for manufacturing a display element, and a method for manufacturing the same. To this end, the present invention provides a flexible hybrid substrate for a display and a method for manufacturing the same, the flexible hybrid substrate for a display comprising: an ultra-thin plate glass; a first transparent thin film formed on one surface of the ultra-thin plate glass; and a second transparent thin film formed on the other surface of the ultra-thin plate glass, wherein the second transparent thin film includes a transparent conductive polymer.

10 Claims, 1 Drawing Sheet

(52) U.S. Cl.
CPC ............ *H05K 1/09* (2013.01); *H05K 3/0067* (2013.01); *H05K 2201/0317* (2013.01)

(56) References Cited

U.S. PATENT DOCUMENTS

| | | | |
|---|---|---|---|
| 2014/0202734 A1 | 7/2014 | Ju et al. | |
| 2016/0042268 A1* | 2/2016 | Puttkammer | H05K 1/0275 235/375 |

FOREIGN PATENT DOCUMENTS

| | | |
|---|---|---|
| KR | 2011-0135612 A | 12/2011 |
| KR | 20130007915 A | 1/2013 |
| KR | 20130026921 A | 3/2013 |

* cited by examiner

FLEXIBLE HYBRID SUBSTRATE FOR DISPLAY AND METHOD FOR MANUFACTURING SAME

CROSS-REFERENCE TO RELATED APPLICATION

This application is a national phase entry under 35 U.S.C. § 371 of International Application No. PCT/KR2014/011306, filed Nov. 24, 2014, published in Korean, which claims priority to Korean Patent Application No. 10-2013-0144503, filed on Nov. 26, 2013, the disclosures of which are incorporated herein by reference.

TECHNICAL FIELD

The present disclosure relates to a flexible hybrid substrate for a display and a manufacturing method thereof. More particularly, the present disclosure relates to a flexible hybrid substrate for a display and a manufacturing method thereof, the flexible hybrid substrate having a reduced level of brittleness, an improved level of flexibility, and being applicable to a high-temperature process for the manufacturing of a display element.

BACKGROUND ART

The display device market has experienced a rapid change in product trends, away from cathode ray tube (CRT) display devices towards flat panel displays (FPDs). Representative examples of FPDs are Liquid Crystal Displays (LCDs), Plasma Display Panels (PDPs), Organic Light Emitting Diode (OLED) display devices, and the like, all of which are lighter, thinner, and easier to manufacture in larger sizes, as compared to CRT display devices.

Recently, research into FPDs has achieved technical developments in terms of imparting flexibility to FPDs to allow such displays to be flexible like paper, in addition to having light and thin profiles. It is therefore essential to select a substrate which forms a substantial portion of the thickness of the FPD while serving as a base for the deposition of various elements or protecting elements from the external environment. However, only a limited number of materials satisfy all of these three characteristics, such as being lightweight while having a thin profile and flexibility, while having their own particular advantages and disadvantages. Therefore, it is difficult to actually apply such materials to display substrates.

RELATED ART DOCUMENT

Korean Patent Laid-Open Publication No. 10-2011-0135612 (Dec. 19, 2011)

DISCLOSURE

Technical Problem

Accordingly, the present disclosure has been made in consideration of the above problems occurring in the related art, and the present disclosure is provided to propose a flexible hybrid substrate for a display and a manufacturing method thereof, the flexible hybrid substrate having a reduced level of brittleness, an improved level of flexibility, and being applicable to a high-temperature process for the manufacturing of a display element.

In addition, another object of the present disclosure is to provide a flexible hybrid substrate for a display and a manufacturing method thereof, the flexible hybrid substrate being applicable for use as a sensor substrate for a touch panel or a cover substrate for a flexible display device.

Technical Solution

According to an aspect of the present disclosure, provided is a flexible hybrid substrate for a display. The flexible hybrid substrate may include: an ultra-thin glass plate; a first transparent thin film formed on one surface of the ultra-thin glass plate; and a second transparent thin film formed on the other surface of the ultra-thin glass plate. The second transparent thin film being comprised of a transparent conductive polymer.

Here, the transparent conductive polymer may be a silver (Ag) nanowire.

In addition, the transparent conductive polymer may be PEDOT-PSS.

In addition, the thickness of the second transparent thin film may be greater than the thickness of the first transparent thin film.

Here, the thickness of the first transparent thin film may range from 10 nm to 500 nm, and the thickness of the second transparent thin film may range from 2 μm to 100 μm.

In addition, the thickness of the ultra-thin glass plate may range from 50 μm to 200 μm.

In addition, the first transparent thin film may be patterned.

Here, the second transparent thin film may be patterned.

According to another aspect of the present disclosure, provided is a method of manufacturing a flexible hybrid substrate for a display. The method may include: a first step of forming a first transparent thin film on one surface of an ultra-thin glass plate, the first transparent thin film comprising a first transparent conductive material; and a second step of forming a second transparent thin film on the other surface of the ultra-thin glass plate, the second transparent thin film comprising a second transparent conductive material. The second transparent conductive material is a transparent conductive polymer.

Here, the first and second steps may be performed using a roll-to-roll process.

In addition, the second step may include forming the second transparent thin film on the other surface of the ultra-thin glass plate using a wet coating method.

In addition, the second step may include forming a film from the second conductive material and then laminating the other surface of the ultra-thin glass plate with the film, such that the second transparent thin film is formed on the other surface of the ultra-thin glass plate.

Advantageous Effects

According to the present disclosure, the substrate has a hybrid structure including the transparent thin film, the ultra-thin glass plate, and the transparent conductive polymer. Thus, the substrate has a reduced level of brittleness, an improved level of flexibility, and is applicable in a high-temperature process for the manufacturing of a display element.

Further, according to the present disclosure, the substrate provides a noise-blocking effect when used as a substrate for a touch panel. In addition, the substrate can further improve the flexibility of display elements when used as a cover substrate for a flexible display device.

Furthermore, according to the present disclosure, a thin, light flexible substrate can be realized.

MODE FOR INVENTION

Hereinafter, reference will be made in detail to a flexible hybrid substrate for a display and a manufacturing method thereof according to the present disclosure, exemplary embodiments of which are illustrated in the accompanying drawings.

In the following description, detailed descriptions of known functions and components will be omitted in the case that the subject matter of the present disclosure is rendered unclear by the inclusion thereof.

Figure 1:
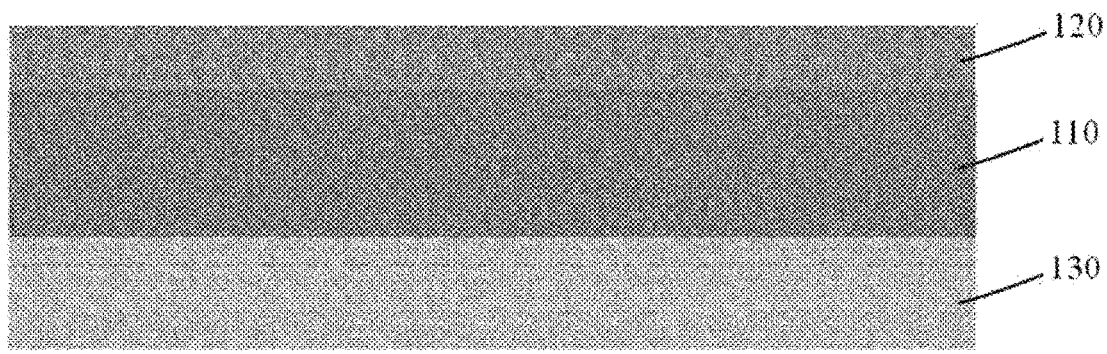
FIG. 1 is a schematic cross-sectional view illustrating a flexible hybrid substrate for a display according to an exemplary embodiment.

As illustrated in FIG. 1, a flexible hybrid substrate 100 for a display according to an exemplary embodiment may be used as a cover substrate for a flexible flat panel display device. The flexible hybrid substrate 100 for a display includes an ultra-thin glass plate 110, a first transparent thin film 120, and a second transparent thin film 130.

Since the ultra-thin glass plate 110 is applied to a flexible flat display device, the ultra-thin glass plate itself must be flexible. In this regard, the ultra-thin glass plate 110 is formed at a thickness ranging from 50 μm to 200 μm. When the ultra-thin glass plate 110 is formed to have a micrometer-scale thickness, the ultra-thin profile of the glass plate allows for flexibility and satisfies thinness and lightness requirements that flat panel display devices basically need.

In addition, the ultra-thin glass plate 110 has improved high-temperature stability as compared to a plastic material that is conventionally used as a substrate material in order to provide flexibility, so the ultra-thin glass plate can be reliably used in high temperature processing for the growth or formation of an element during the manufacturing of a display device. That is, when the substrate 100 including the ultra-thin glass plate 110 according to the present embodiment is applied to a flat panel display device, the substrate 100 is advantageous for high temperature processing. The ultra-thin glass plate 110 may be formed from silicate glass, silica glass, borosilicate glass, non-alkali glass, or the like.

The first transparent thin film 120 is formed on the top surface (when viewed in the direction of the drawing) of the ultra-thin glass plate 110. The first transparent thin film 120 may be formed to be thinner than the second transparent thin film 130. In the present embodiment, the thickness of the first transparent thin film 120 may range from 10 nm to 500 nm. In addition, the first transparent thin film 120 may be formed from a transparent conductive thin film. For example, the first transparent thin film 120 may be formed from an indium tin oxide (ITO) or amorphous ITO. Here, since the flexible hybrid substrate 100 according to the present embodiment is used as a cover substrate for a flat panel display device, the first transparent thin film 120 exposed externally is not necessarily conductive. However, such an application of the flexible hybrid substrate 100 to a flat panel display device is merely an illustrative example, so the flexible hybrid substrate can be used as a sensor substrate for a touch panel through a certain process, as in the following embodiment. That is, according to the present embodiment, the flexible hybrid substrate 100 for a display has the first transparent thin film 120 formed from a transparent conductive thin film in order to be compatible when used as a substrate other than a cover substrate for a flat panel display device.

The second transparent thin film 130 is formed on the bottom surface (when viewed in the direction of the drawing) of the ultra-thin glass plate 110. In the present embodiment, the second transparent thin film 130 is formed from a transparent conductive polymer. For example, the second transparent thin film 130 may be formed from a transparent conductive polymer in which a silver (Ag) nanowire is contained in polymer. In addition, the second transparent thin film 130 may be formed from PEDOT-PSS, a conductive polymer. As described above, when the second transparent thin film 130 is formed from a transparent conductive polymer, the radius of curvature of the transparent thin film 130 may be decreased, due to an increase in the level of flexibility, thereby contributing to improvements in the flexibility of the flexible hybrid substrate 100 for a display.

In addition, the second transparent thin film 130 may be formed to be thicker that the first transparent thin film 120. That is, the thickness of the second transparent thin film 130 may range from 2 μm to 100 μm, which is greater than the thickness of the first transparent thin film 120 ranging from 10 nm to 500 nm. In the present embodiment, the second transparent thin film 130 serves as a shock-absorbing material to prevent the ultra-thin glass plate 110 from breaking. Therefore, the second transparent thin film 130 is formed to have a micrometer-scale thickness in order to be sufficiently thick, unlike the first transparent thin film 120 having a nanometer-scale thickness.

As described before, since the flexible hybrid substrate 100 for a display has a hybrid structure including the first transparent thin film 120, the ultra-thin glass plate 110, and the second transparent thin film 130 formed from a conductive polymer, the flexible hybrid substrate 100 for a display has a reduced level of brittleness, has an improved level of flexibility, and can be reliably used in a high temperature process, thereby being able to be used as a cover substrate for a flexible flat panel display device.

Hereinafter, a flexible hybrid substrate for a display according to another exemplary embodiment will be described with reference to FIG. 2.

Figure 2:
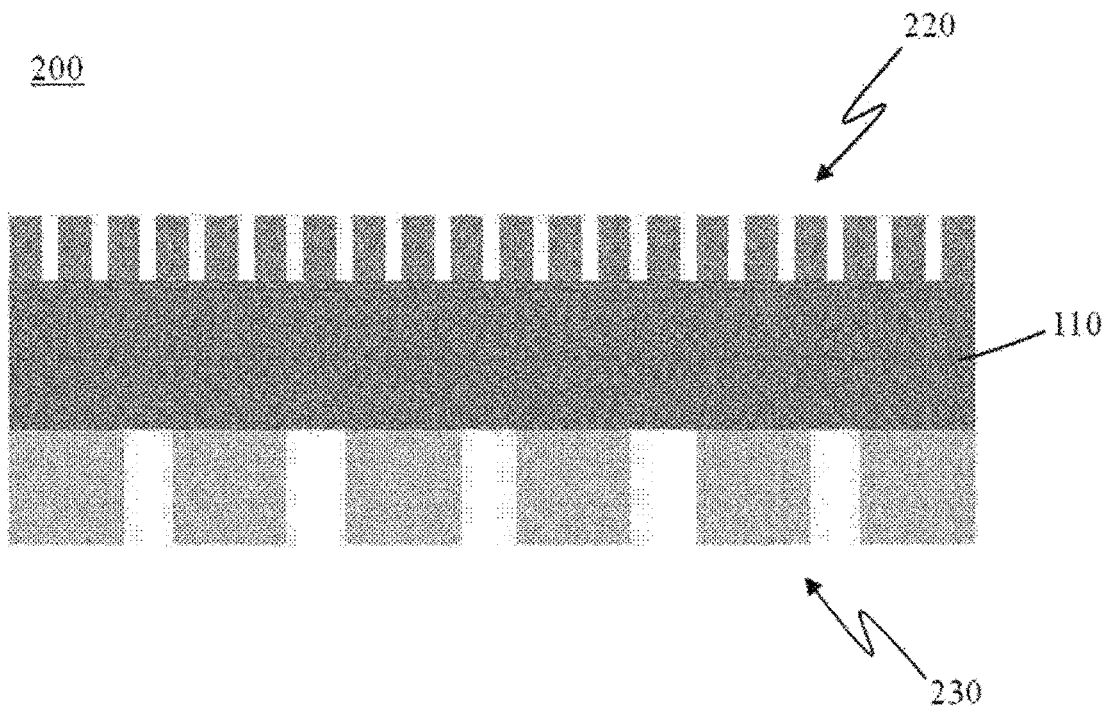
FIG. 2 is a schematic cross-sectional view illustrating a flexible hybrid substrate for a display according to another exemplary embodiment.

FIG. 2 is a schematic cross-sectional view illustrating the flexible hybrid substrate for a display according to the present embodiment.

As illustrated in FIG. 2, the flexible hybrid substrate 200 for a display is a substrate able to be used as a sensor substrate for a touch panel. The flexible hybrid substrate 200 for a display includes an ultra-thin glass plate 110, a first transparent thin film 220, and a second transparent thin film 230.

Comparing the present embodiment to the former embodiment, the transparent thin films have different structures, while the ultra-thin glass plates are the same. Thus, the ultra-thin glass plate is designated with the same reference numeral, and a detailed description thereof will be omitted.

In the present embodiment, the first transparent thin film 220 is formed on the upper surface (when viewed in the direction of the drawing) of the ultra-thin glass plate 110. The material and thickness or the first transparent thin film 220 are the same as those of the first transparent thin film 120 according to the former embodiment.

When the flexible hybrid substrate 200 for a display is used as a sensor substrate for a touch panel, the first transparent thin film 220 acts as an electrode to detect x-axis and y-axis coordinates. In this regard, the first transparent thin film 220 is patterned to be divided into an electrode for detecting x-axis coordinates of the ultra-thin glass plate and an electrode for detecting y-axis coordinates of the ultra-thin glass plate. Here, the patterned first transparent thin film 220 may be visible from the outside due to the patterning, thereby degrading the appearance of the touch panel. In order to prevent this, an index matching layer (IML) (not shown) may be disposed between the ultra-thin glass plate 110 and the first transparent thin film 220.

The second transparent thin film 230 is formed on the bottom surface (when viewed in the direction of the drawing) of the ultra-thin glass plate 110. The material and thickness of the second transparent thin film 230 are the same as those of the second transparent thin film 130 according to the former embodiment.

Like the first transparent thin film 220, the second transparent thin film 230 is patterned. Here, when the patterned first transparent thin film 220 is formed to act only as an electrode to detect only x-axis coordinates, the patterned second transparent thin film 230 acts only as an electrode to detect y-axis coordinates.

In addition, the second transparent thin film 230 formed from a polymer and patterned to be highly resistant may also serve as a noise shield for a power supply driving signals against noise due to microwaves generated by a touch panel.

Hereinafter, reference will be made to a method of manufacturing a flexible hybrid substrate for a display according to an exemplary embodiment. Here, the reference numerals in FIG. 1 will be used to designate the components of the flexible hybrid substrate.

The method of manufacturing a flexible hybrid substrate for a display according to the present embodiment includes forming a first transparent thin film 120 formed from a transparent conductive material on one surface of an ultra-thin glass plate 110. The transparent conductive material may be indium tin oxide (ITO) or amorphous ITO. One surface of the ultra-thin glass plate 110 may be coated with the transparent conductive material using a sputtering method. Here, a roll-to-roll process may be performed to coat the ultra-thin glass plate 110 with the first transparent thin film 120.

Subsequently, the method includes forming a second transparent thin film 130 on the other surface of the ultra-thin glass plate 110. The second transparent thin film 130 is formed from a conductive material, for example, an Ag nanowire or a transparent conductive polymer, such as PEDOT-PSS. In this step, the formation of the second transparent thin film 130 on the other surface of the ultra-thin glass plate 110 may be carried out using a wet coating method, such as slot-die coating, slit coating, or screen printing. Alternatively, in this step, the formation of the second transparent thin film 130 on the other surface of the ultra-thin glass plate 110 may be carried out by forming a transparent conductive polymer film and then laminating the other surface of the ultra-thin glass plate 110 with the transparent conductive polymer film. Here, like the first transparent thin film 120, the second transparent thin film 130 may be formed using a roll-to-roll process.

When the second transparent thin film 130 is formed on the other surface of the ultra-thin glass plate 110 as described above, a flexible substrate 100 having a hybrid structure including the first transparent thin film 120, the ultra-thin glass plate 110, and the second transparent thin film 130 stacked one on top of the other is manufactured. The flexible hybrid substrate 100 can be used as a cover substrate for a flexible flat panel display device. When the flexible substrate 100 is intended to be used as a sensor substrate for a touch panel, the first transparent thin film 120 may be patterned to form an electrode to detect x-axis and y-axis coordinates, and the second transparent thin film 130 may also be patterned to provide a noise-blocking function to the touch panel.

The foregoing descriptions of specific exemplary embodiments of the present disclosure have been presented with respect to the drawings. They are not intended to be exhaustive or to limit the present disclosure to the precise forms disclosed herein, and many modifications and variations are obviously possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. A flexible hybrid substrate for a display comprising:
an ultra-thin glass plate;
a first transparent thin film formed on one surface of the ultra-thin glass plate; and
a second transparent thin film formed on the other surface of the ultra-thin glass plate,
the second transparent thin film comprising a transparent conductive polymer;
wherein a thickness of the second transparent thin film is greater than a thickness of the first transparent thin film, and
the thickness of the first transparent thin film ranges from 10 nm to 500 nm, and the thickness of the second transparent thin film ranges from 2 μm to 100 μm.

2. The flexible hybrid substrate of claim 1, wherein the transparent conductive polymer comprises a silver (Ag) nanowire.

3. The flexible hybrid substrate of claim 1, wherein the transparent conductive polymer comprises PEDOT-PSS.

4. The flexible hybrid substrate of claim 1, wherein a thickness of the ultra-thin glass plate ranges from 50 μm to 200 μm.

5. The flexible hybrid substrate of claim 1, wherein the first transparent thin film is patterned.

6. The flexible hybrid substrate of claim 5, wherein the second transparent thin film is patterned.

7. A method of manufacturing a flexible hybrid substrate for a display, the method comprising:
a first step of forming a first transparent thin film on one surface of an ultra-thin glass plate, the first transparent thin film comprising a first transparent conductive material; and
a second step of forming a second transparent thin film on the other surface of the ultra-thin glass plate, the second transparent thin film comprising a second transparent conductive material,
the second transparent conductive material comprising a transparent conductive polymer;
wherein a thickness of the second transparent thin film is greater than a thickness of the first transparent thin film, and
the thickness of the first transparent thin film ranges from 10 nm to 500 nm, and the thickness of the second transparent thin film ranges from 2 μm to 100 μm.

8. The method of claim 7, wherein the first and second steps are performed in a roll-to-roll process.

9. The method of claim 7, wherein the second step comprises forming the second transparent thin film on the other surface of the ultra-thin glass plate using a wet coating.

10. The method of claim 7, wherein the second step comprises forming a film from the second conductive material and then laminating the other surface of the ultra-thin glass plate with the film as the second transparent thin film.

\* \* \* \* \*